(12) United States Patent
Inoue et al.

(10) Patent No.: US 7,230,259 B2
(45) Date of Patent: Jun. 12, 2007

(54) OPTICAL COUPLING DEVICE INCLUDING LEAD FRAME HAVING A CONVEXITY AND METHOD OF MANUFACTURING THE DEVICE

(75) Inventors: Kazuhiro Inoue, Fukuoka-ken (JP); Takeshi Biwa, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/879,072

(22) Filed: Jun. 30, 2004

(65) Prior Publication Data
US 2005/0023441 A1 Feb. 3, 2005

(30) Foreign Application Priority Data
Jul. 11, 2003 (JP) ............................ P2003-195680

(51) Int. Cl.
*H01J 5/02* (2006.01)
*G02B 27/00* (2006.01)
*H01L 27/15* (2006.01)

(52) U.S. Cl. .................... 250/551; 250/239; 257/81

(58) Field of Classification Search ................ 250/551, 250/239; 257/81
See application file for complete search history.

(56) References Cited

U.S. PATENT DOCUMENTS

| 4,712,017 | A | * | 12/1987 | Kamasaki | .................... 250/551 |
| 4,863,806 | A | | 9/1989 | Merrick et al. | ............. 428/571 |
| 4,980,568 | A | * | 12/1990 | Merrick et al. | ............. 250/551 |
| 5,631,192 | A | | 5/1997 | Heppler et al. | ................ 438/25 |
| 6,031,251 | A | | 2/2000 | Gempe et al. | .................... 257/84 |
| 6,885,016 | B2 | * | 4/2005 | Worley et al. | ............. 250/551 |
| 2003/0201462 | A1 | * | 10/2003 | Pommer et al. | ............ 257/200 |

* cited by examiner

Primary Examiner—Georgia Epps
Assistant Examiner—Brian Livedalen
(74) Attorney, Agent, or Firm—Oblon, Spivak, McClelland, Maier & Neustadt, P.C.

(57) ABSTRACT

An optical semiconductor device comprises a lead frame having, on a main surface thereof, a light-emitting element mount portion, and a light-receiving element mount portion formed to be convex. The optical semiconductor device comprises a light-emitting element mounted on the light-emitting element mount portion, and a light-receiving element mounted on the light-receiving element mount portion such that a light-receiving area faces the light-emitting element.

24 Claims, 5 Drawing Sheets

OPTICAL COUPLING DEVICE INCLUDING LEAD FRAME HAVING A CONVEXITY AND METHOD OF MANUFACTURING THE DEVICE

CROSS-REFERENCE TO RELATED APPLICATIONS

This application is based upon and claims the benefit of priority from the prior Japanese Patent Application No. 2003-195680, filed Jul. 11, 2003, the entire contents of which are incorporated herein by reference.

FIELD OF THE INVENTION

The present invention relates to an optical semiconductor device having a structure in which a light-emitting element and a light-receiving element are placed to face each other, and relates to a method of manufacturing the same.

BACKGROUND OF THE INVENTION

In optical semiconductor devices including photocouplers and photorelays, a structure has been used in which a light-emitting element and a light-receiving element are respectively mounted on lead frames and in which the light-emitting element and the light-receiving element are sealed in the state where the light-emitting element and the light-receiving element are placed to face each other (e.g., refer to Japanese Unexamined Patent Publication No. Hei 6(1994)-224245).

FIG. 8 shows a known optical semiconductor device by taking as an example a photocoupler having a double sealed structure. As shown in FIG. 8, a light-emitting element 23 and a light-receiving element 24 are respectively mounted on lead frames 21a and 21b, and light-emitting element 23 and light-receiving element 24 are placed to face each other. These elements are primarily sealed with optically transparent resin 25, and secondarily sealed with light-blocking resin 26.

Such a photocoupler is formed as follows. As shown in FIG. 9, light-emitting element 23 and light-receiving element 24 are mounted on lead frames 21a and 21b, respectively. Then, as shown in FIG. 10, light-emitting element 23 and light-receiving element 24 are placed in the state where they face each other.

As shown in FIG. 11, these are primarily sealed with optically transparent resin 25, thus forming a light channel. Then, as shown in FIG. 12, the elements are secondarily sealed with light-blocking resin 26 in order to block light and protect the elements. Lead frames 21a and 21b are formed, thus forming the photocoupler shown in FIG. 8.

In recent years, with the trend toward higher performance of semiconductor devices and the improvement of packaging density, it has been strongly demanded that optical semiconductor devices be miniaturized. However, as described above, in a known optical semiconductor device, secondary sealing is performed in such a manner that the respective lead frames on the light-emitting and light-receiving sides, which face each other, are covered.

It is necessary to ensure certain degrees of thicknesses of secondary sealing resin on these lead frames. It is difficult to reduce the lead frames themselves, which occupy certain volumes. Accordingly, there has been a limit to miniaturization.

SUMMARY OF THE INVENTION

An optical semiconductor device according to an embodiment of the present invention comprises a lead frame having, on a main surface thereof, a light-emitting element mount portion, and a light-receiving element mount portion formed to be convex, a light-emitting element mounted on the light-emitting element mount portion, and a light-receiving element mounted on the light-receiving element mount portion such that a light-receiving area faces the light-emitting element.

A method of manufacturing an optical semiconductor device according to another embodiment of the present invention, the method comprises forming a lead frame in which a light emitting-side lead frame and a light receiving-side lead frame with a convex portion are integrated, mounting a light-emitting element on a light-emitting element mount portion of the light emitting-side lead frame, and bonding the light-emitting element to the light-emitting element mount portion, forming a transistor on a light-receiving element mount portion of the light receiving-side lead frame, and mounting a light-receiving element on the transistor such that a light-receiving area faces the light-emitting element, and bonding the light-receiving element to the transistor.

An optical semiconductor device according to another embodiment of the present invention comprises a pair of lead frames including a first frame having a first surface and a second frame having a second surface, the first frame being separated from the second frame in horizontal direction, a first element mounted on the first surface; and a second element having a first portion and a second portion, the first portion connected to the second surface and the second portion overhanging the first element for facing to the first element, wherein the first element is one of the light-emitting element and the light-receiving element, and the second element is another one of the light-emitting element and the light-receiving element.

DETAILED DESCRIPTION OF THE INVENTION

Hereinafter, embodiments of the present invention will be described with reference to drawings.

(First Embodiment)

Figure 1:
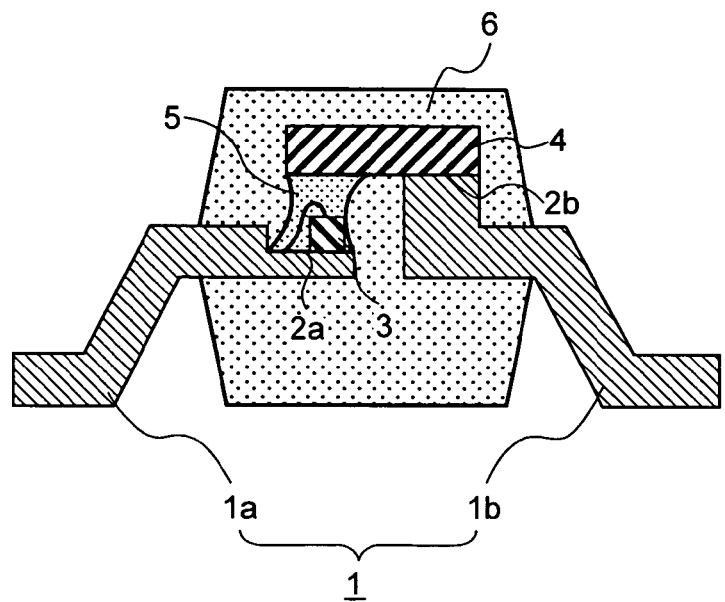
FIG. 1 is a diagram showing an optical semiconductor device according to an embodiment of the present invention.

FIG. 1 shows a cross-sectional view of an optical semiconductor device of the present embodiment.

As shown in FIG. 1, there is a contour strip lead frame 1 (1a, 1b) having concave and convex portions. A first frame 1a is separated from a second frame 1b in horizontal direction. A light-emitting element 3 is mounted on a bed 2a (light-emitting element mount portion) formed by the concave portion of lead frame 1a. A light-receiving element 4 is mounted on a bed 2b (light-receiving element mount portion) formed by the convex portion of lead frame 1b.

Light-emitting element 3 and light-receiving element 4 are sealed with optically transparent primary sealing resin 5, and further sealed with light-blocking secondary sealing resin 6. In FIG. 1, entire light-emitting element 3 is covered with optically transparent primary sealing resin 5, but light-receiving element 4 is partially covered with optically transparent primary sealing resin 5.

In the optical semiconductor device of the present embodiment, which has the above-described structure, an electric signal from the outside causes light-emitting element 3 to emit light, and an optical signal is transmitted to light-receiving element 4 through primary sealing resin 5. Then, the optical signal is converted into an electric signal in light-receiving element 4 and outputted.

The optical semiconductor device of the present embodiment is formed as follows.

Figure 2:
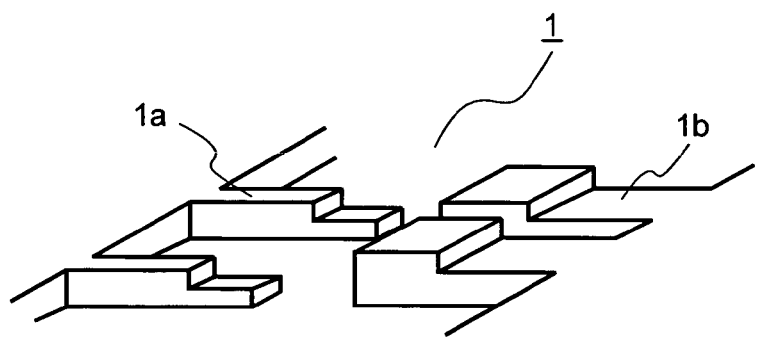
FIG. 2 is a diagram showing a step in the manufacture of the optical semiconductor device according to the embodiment of the present invention.

Lead frame 1 in which light emitting-side lead frame 1a having the concave portion and light receiving-side lead frame 1b having the convex portion are integrated as shown in FIG. 2 is formed by pressing, etching, or the like. At this time, the distance between light-emitting side 1a and light-receiving side 1b is controlled to be a predetermined distance, and the heights of the concave and convex portions (concave portion thickness and convex portion thickness) and the widths thereof are controlled to have predetermined values.

Figure 3:
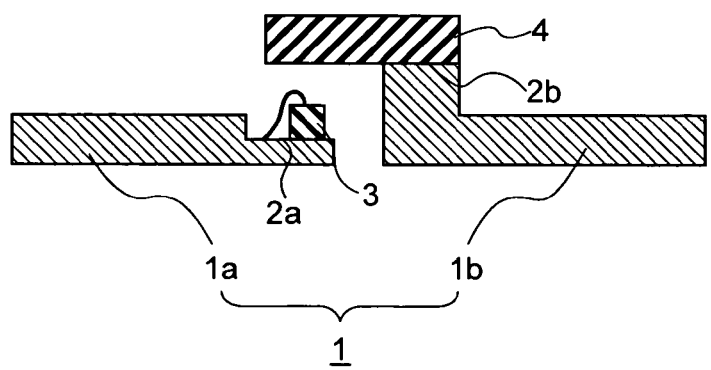
FIG. 3 is a diagram showing a step in the manufacture of the optical semiconductor device according to the embodiment of the present invention.

As shown in FIG. 3, light-emitting element 3 is mounted on bed 2a (light-emitting element mount portion) formed by the concave portion, and wire bonding is performed. Light-receiving element 4 is mounted on bed 2b (light-receiving element mount portion) formed by the convex portion, and connected to lead frame 1b. Light-receiving element 4 has a light-receiving area 4a (a first portion) and mount area 4b (a second portion). The first portion connected to the second surface and the second portion overhanging light-emitting element 3 for facing to light-emitting element 3.

Figure 4:
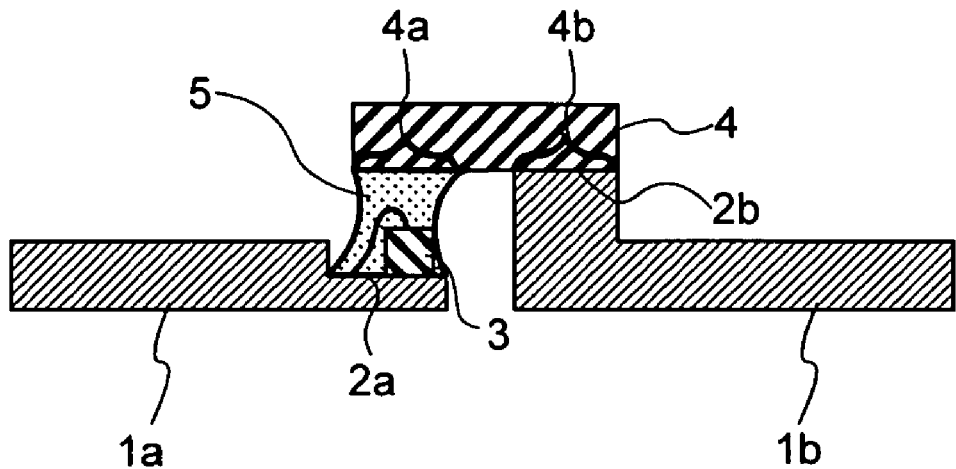
FIG. 4 is a diagram showing a step in the manufacture of the optical semiconductor device according to the embodiment of the present invention.

As shown in FIG. 4, light-emitting element 3 and light-receiving element 4 are sealed with optically transparent primary sealing resin 5. Primary sealing resin 5 forms a light channel. That is, light-receiving area 4a, which receives an optical signal from light-emitting element 3, is covered with primary sealing resin 5. Light-receiving area 4a and an area (mount area 4b) connected to bed 2b are formed on the same surface of light-receiving element 4.

Figure 5:
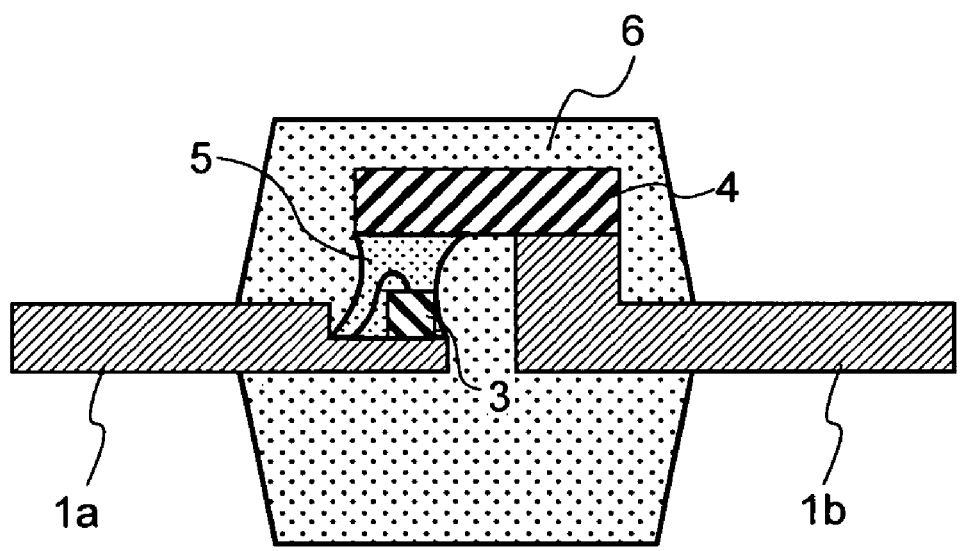
FIG. 5 is a diagram showing a step in the manufacture of the optical semiconductor device according to the embodiment of the present invention.

As shown in FIG. 5, these are sealed with light-blocking secondary sealing resin 6. Secondary sealing resin 6 makes it possible to block light from the outside.

Thereafter, lead frames 1a and 1b exposed from sealing resin 6 are formed for packaging, thus forming the optical semiconductor device shown in FIG. 1.

In the optical semiconductor device of the present embodiment, the volume can be reduced by the amount corresponding to the thickness of a lead frame heretofore connected to the back of the light-receiving element, and a small package capable of responding to marketing needs can be realized.

Furthermore, heretofore, there has been a need for the step of placing lead frames on light-emitting and light-receiving sides to face each other and the step of holding and sealing these. However, in the present embodiment, the light-emitting element and the light-receiving element are mounted on the lead frame in which the light-emitting side and the light-receiving side are integrated. Accordingly, a conventional bonding step for placing lead frames on light-emitting and light-receiving sides to face each other and holding them before primary sealing can be omitted, thus making it possible to shorten a process.

Although lead frame 1a has the concave portion in the present embodiment, lead frame 1a does not need to have a concave portion. However, forming the concave portion in the lead frame 1a brings about the effects of further reducing the volume, injecting the primary sealing resin with high accuracy, and the like.

(Second Embodiment)

Figure 6A:
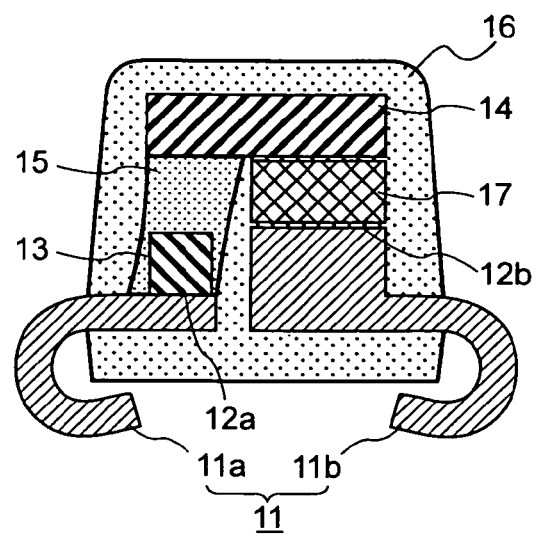
FIG. 6A is a diagram showing an optical semiconductor device according to another embodiment of the present invention.
Figure 6B:
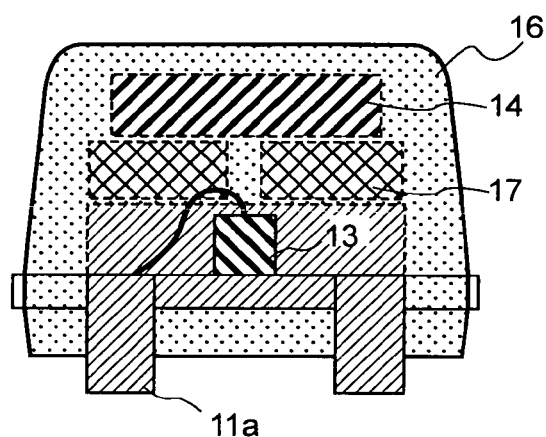
FIG. 6B is a diagram showing the optical semiconductor device according to the another embodiment of the present invention.
Figure 6C:
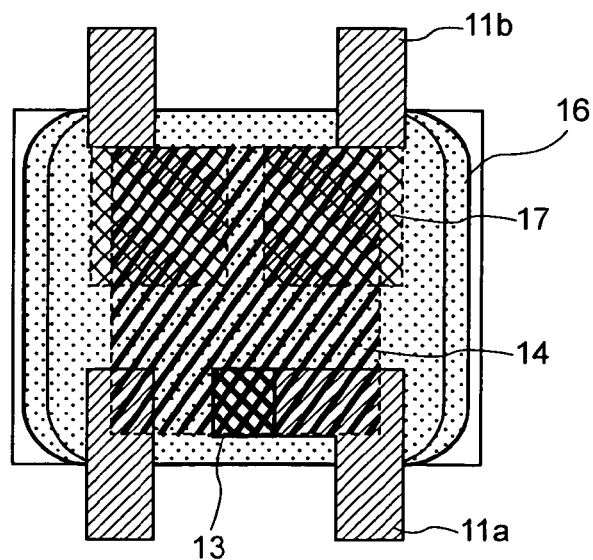
FIG. 6C is a diagram showing the optical semiconductor device according to the another embodiment of the present invention.

FIGS. 6A to 6C show an optical semiconductor device of the present embodiment. FIGS. 6A to 6C are cross-sectional views of the optical semiconductor device of the present embodiment seen from the longitudinal direction of a lead frame, the lateral direction thereof, and above, respectively.

As shown in FIG. 6A, a contour strip lead frame 11 having a convex portion is used. The distance between a light emitting-side lead frame 11a and a light receiving-side lead frame 11b of lead frame 11 is controlled to be a predetermined distance, and the height of the convex portion (convex portion thickness) and the width thereof are controlled to have predetermined values.

A light-emitting element 13 is mounted on a bed 12a (light-emitting element mount portion). Two MOS-FETs 17 and a light-receiving element 14 are sequentially mounted on a bed 12b (light-receiving element mount portion) formed by the convex portion. Light-emitting element 13 and light-receiving element 14 are sealed with optically transparent primary sealing resin 15, and further sealed with light-blocking secondary sealing resin 16. Outer lead frames are bent to be J-shaped at a predetermined curvature radius R for packaging.

Figure 7:
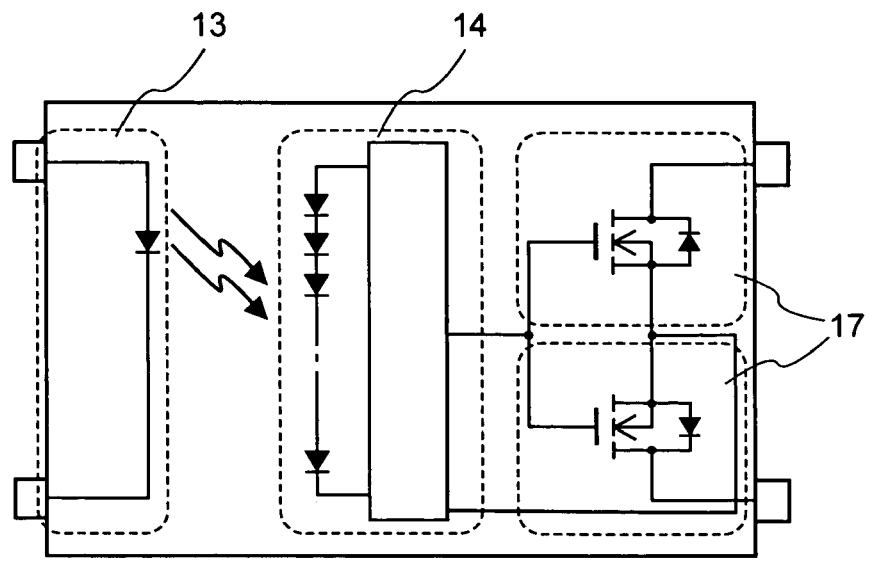
FIG. 7 is a diagram showing the circuit configuration of the optical semiconductor device according to the another embodiment of the present invention.
Figure 8:
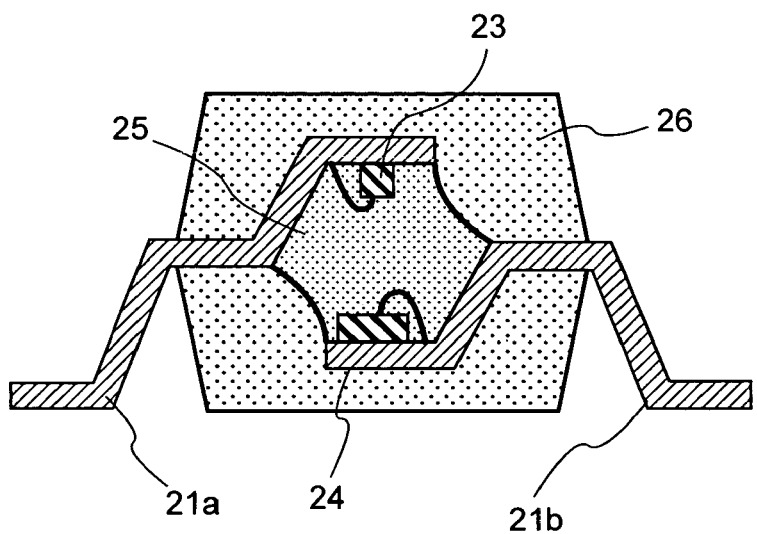
FIG. 8 is a diagram showing a known optical semiconductor device.
Figure 9:
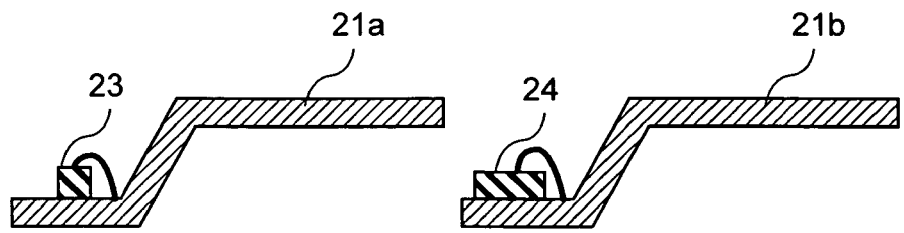
FIG. 9 is a diagram showing a step in the manufacture of the known optical semiconductor device.
Figure 10:
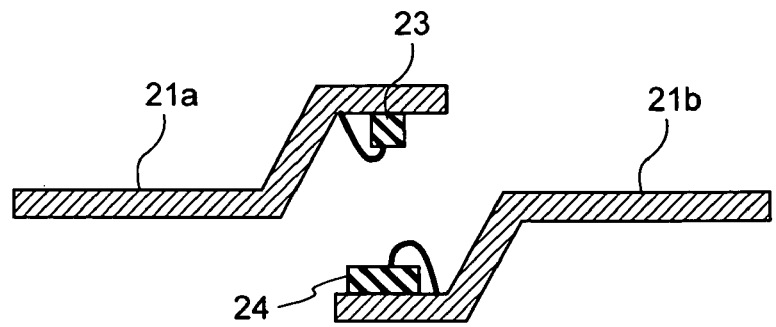
FIG. 10 is a diagram showing a step in the manufacture of the known optical semiconductor device.
Figure 11:
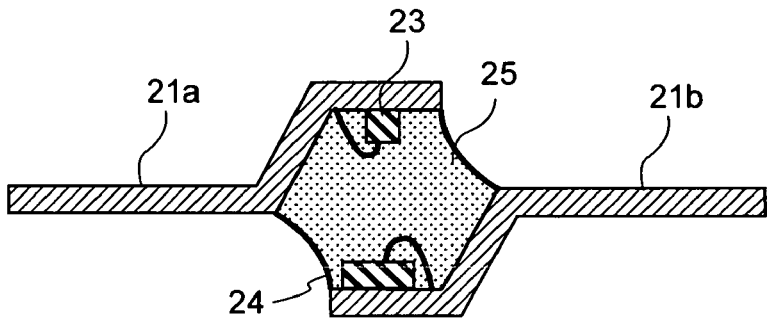
FIG. 11 is a diagram showing a step in the manufacture of the known optical semiconductor device.
Figure 12:
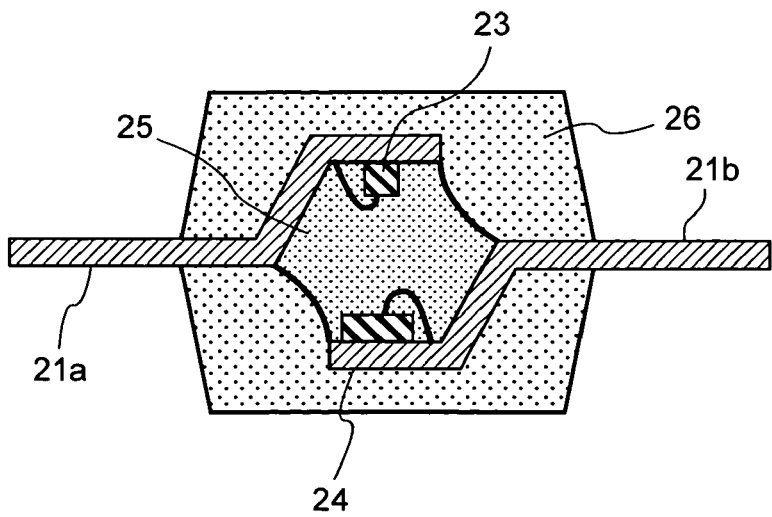
FIG. 12 is a diagram showing a step in the manufacture of the known optical semiconductor device.

Adopting the circuit configuration shown in FIG. 7, an electric signal from the outside causes light-emitting element 13 to emit light, and an optical signal is transmitted to light-receiving element 14 through primary sealing resin 15. Then, the optical signal is converted into an electric signal in light-receiving element 14, and outputted through transistors (MOS-FETs) 17. The optical semiconductor device thus functions as a switching element.

The optical semiconductor device of the present embodiment is formed similarly to the first embodiment until the light-emitting element is mounted, but differs from that of the first embodiment in that MOS-FETs 17 are mounted on bed 12b. That is, MOS-FETs 17 are mounted on bed 12b and connected to lead frame 11b. Light-receiving element 14 is mounted on MOS-FETs 17 with Au balls interposed therebetween and connected to MOS-FETs 17 by using ultrasonic waves and thermocompression bonding in combination (FCB: flip-chip bonding). Note that the light-emitting element is connected to lead frame 1a by general gold-wire bonding.

In the optical semiconductor device of the present embodiment, an effect similar to that of the first embodiment can be obtained. In addition, since the light-receiving element can be connected to the tops of the MOS-FETs by FCB, further miniaturization can be achieved compared to heretofore adopted wire bonding.

The contour strip lead frames used in the first and second embodiments can be used not only in an optical semiconductor device in which a light-emitting element and a light-receiving element face each other but also in a power IC and a power LED in which importance is placed on heat dissipation. Heretofore, heatsinks are attached to these devices in addition to lead frames. However, using part of a contour strip lead frame as a heatsink, a heatsink and a frame can be integrated.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An optical coupling device comprising:
    a lead frame comprising a first frame and a second frame, the first frame including a protrusion portion with a first thickness and having a frame main surface, and the second frame including a protrusion portion with a second thickness and having a second frame main surface, the second thickness being greater than the first thickness;
    a light-emitting element mounted on the protrusion portion of the first frame main surface; and
    a light-receiving element mounted on the protrusion portion of the second frame such that a light-receiving area of the light-receiving element faces the light-emitting element.

2. The optical coupling device according to claim 1, wherein in the light-receiving element, the light-receiving area and a mount area connected to the second frame, are formed on a same surface.

3. The optical coupling device according to claim 1, wherein the first thickness of the protrusion portion of the first frame main surface is smaller than a thickness of the first frame, and the light-emitting element is mounted on the protrusion portion of the first frame main surface.

4. The optical coupling device according to claim 1, further comprising:
    optically transparent primary sealing resin covering the light-emitting element and at least part of the light-receiving element; and
    light-blocking secondary sealing resin covering the primary sealing resin.

5. The optical coupling device according to claim 1, further comprising:
    a transistor mounted on the second frame.

6. The optical coupling device according to claim 5, wherein the light-receiving element is connected to the transistor by flip-chip bonding.

7. A method of manufacturing an optical coupling device, the method comprising:
    forming a lead frame in which a first frame having a protrusion portion with a first thickness and a second frame with a protrusion portion having a second thickness greater than the first thickness are integrated;
    mounting a light-emitting element on the protrusion portion of the first frame;
    bonding the light-emitting element to the first frame;
    mounting a light-receiving element on the second frame such that a light-receiving area of the light-receiving element faces the light-emitting element; and
    bonding the light-receiving element to the second frame.

8. The method according to claim 7, further comprising:
    covering the light-emitting element and at least part of the light-receiving element with optically transparent primary sealing resin; and
    covering the primary sealing resin with light-blocking secondary sealing resin.

9. A method of manufacturing an optical coupling device, the method comprising:
    forming a lead frame in which a first frame having a protrusion portion with a first thickness and a second frame with a protrusion portion having a second thickness greater than the first thickness are integrated;
    mounting a light-emitting element on the protrusion portion of the first frame;
    bonding the light-emitting element to the first frame;
    forming a transistor on the second frame;
    mounting a light-receiving element on the transistor such that a light-receiving area of the light-receiving element faces the light-emitting element; and
    bonding the light-receiving element to the transistor.

10. The method according to claim 9, further comprising:
    covering the light-emitting element and at least part of the light-receiving element with optically transparent primary sealing resin; and
    covering the primary sealing resin with light-blocking secondary sealing resin.

11. The method according to claim 9, wherein when the light-receiving element is formed on the transistor, the transistor and the light-receiving element are connected by flip-chip bonding.

12. An optical coupling device, comprising:
    a pair of lead frames including a first frame having a protrusion portion with a first surface and a second frame having a protrusion portion with a second surface, the first frame being separated from the second frame in a horizontal direction, the protrusion portion of the second frame being thicker than the protrusion portion of the first frame;
    a first element mounted on the first surface; and
    a second element mounted on the protrusion portion of the second frame, the second element having a first portion and a second portion, the first portion connected to the second surface and the second portion overhanging the first element to face the first element,
    wherein the first element is one of a light-emitting element and a light-receiving element, and the second element is another one of the light-emitting element and the light-receiving element.

13. An optical coupling device according to claim 12, wherein the second portion is directly mounted on the second surface.

14. An optical coupling device according to claim 12 further comprising:
    a transistor mounted on the second surface,
    wherein the light-receiving element is connected to the second surface.

15. An optical coupling device according to claim 12, wherein a height of the second surface is higher than a height of the first surface.

16. An optical coupling device according to claim 13, wherein the first frame has a first upper surface and the second frame has a second lower surface, a height of the first upper surface is the same as a height of the second lower surface, a height of the first surface is lower than the height of the first upper surface and a height of the second surface is higher than the height of the second lower surface.

17. The optical coupling device according to claim 1, wherein the protrusion portion of the second frame extends about perpendicular to the second frame main surface.

18. The optical coupling device according to claim 3, wherein the protrusion portion of the second frame extends about perpendicular to the second frame main surface.

19. The optical coupling device according to claim 1, wherein the first frame main surface is about parallel to a surface of the protrusion portion of the second frame on which the light-receiving element is disposed.

20. The optical coupling device according to claim 16, wherein the protrusion portion of the second frame extends about perpendicular to the second surface.

21. The optical coupling device according to claim 1, wherein the second frame main surface is about perpendicular to a surface of the light-receiving element configured to receive light emitted from the light-emitting element, and the protrusion portion of the second frame is connected to the second frame main surface.

22. The optical coupling device according to claim 21, wherein a portion of the surface of the light-receiving element configured to receive light is mounted to the protrusion portion of the second frame.

23. The optical coupling device according to claim 22, wherein a rear surface of the light-receiving element, which is opposite the surface configured to receive light, is not mounted to the second frame.

24. The optical coupling device according to claim 22, wherein a rear surface of the light-receiving element, which is opposite the surface configured to receive light, is covered by a light blocking resin.

\* \* \* \* \*